(12) United States Patent
Ko et al.

(10) Patent No.: US 8,455,929 B2
(45) Date of Patent: Jun. 4, 2013

(54) FORMATION OF III-V BASED DEVICES ON SEMICONDUCTOR SUBSTRATES

(75) Inventors: Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 310 days.

(21) Appl. No.: 12/827,709

(22) Filed: Jun. 30, 2010

(65) Prior Publication Data

US 2012/0001239 A1 Jan. 5, 2012

(51) Int. Cl.
*H01L 27/085* (2006.01)

(52) U.S. Cl.
USPC .... 257/255; 257/615; 257/347; 257/E29.089; 257/E27.059

(58) Field of Classification Search
USPC .......... 257/24, 187, 622, 374, 347–349, 257/401–413, 615, 255; 438/197
See application file for complete search history.

(56) References Cited

U.S. PATENT DOCUMENTS

| | | | |
|---|---|---|---|
| 5,621,227 A | 4/1997 | Joshi | |
| 6,121,153 A | 9/2000 | Kikkawa | |
| 6,218,685 B1 | 4/2001 | Nogome | |
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,382,021 B2 | 6/2008 | Faulkner et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,936,040 B2 | 5/2011 | Wu | |
| 8,058,692 B2 * | 11/2011 | Lai et al. | 257/374 |
| 8,174,073 B2 * | 5/2012 | Lee et al. | 257/347 |
| 2005/0104137 A1 | 5/2005 | Faulkner et al. | |
| 2005/0153490 A1 | 7/2005 | Yoon et al. | |
| 2005/0186742 A1 | 8/2005 | Oh et al. | |
| 2006/0057856 A1 | 3/2006 | Senda et al. | |
| 2006/0076625 A1 | 4/2006 | Lee et al. | |
| 2006/0148182 A1 | 7/2006 | Datta et al. | |
| 2007/0102763 A1 | 5/2007 | Yeo et al. | |
| 2007/0120156 A1 | 5/2007 | Liu et al. | |
| 2007/0122953 A1 | 5/2007 | Liu et al. | |

(Continued)

FOREIGN PATENT DOCUMENTS

| | | |
|---|---|---|
| CN | 1289149 A | 3/2001 |
| JP | 2005005646 A | 1/2005 |
| KR | 2007-0088817 A | 8/2007 |

OTHER PUBLICATIONS

Chuang, R.W., et al., "Gallium nitride metal-semiconductor-metal photodetectors prepared on silicon substrates," Journal of Applied Physics, vol. 102, 2007, pp. 073110-1-073110-4.

(Continued)

*Primary Examiner* — Dung A. Le
(74) *Attorney, Agent, or Firm* — Slater & Matsil, L.L.P.

(57) ABSTRACT

A device includes a semiconductor substrate, and insulation regions in the semiconductor substrate. Opposite sidewalls of the insulation regions have a spacing between about 70 nm and about 300 nm. A III-V compound semiconductor region is formed between the opposite sidewalls of the insulation regions.

16 Claims, 7 Drawing Sheets

U.S. PATENT DOCUMENTS

| | | | |
|---|---|---|---|
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0238281 | A1 | 10/2007 | Hudait et al. |
| 2007/0243703 | A1 | 10/2007 | Pinnington et al. |
| 2008/0237655 | A1 | 10/2008 | Nakabayashi et al. |
| 2008/0290470 | A1 | 11/2008 | King et al. |
| 2008/0296632 | A1 | 12/2008 | Moroz et al. |
| 2009/0001415 | A1 | 1/2009 | Lindert et al. |
| 2009/0181477 | A1 | 7/2009 | King et al. |
| 2009/0272965 | A1 | 11/2009 | Rachmady et al. |
| 2010/0252816 | A1 | 10/2010 | Ko et al. |
| 2010/0252862 | A1 | 10/2010 | Ko et al. |
| 2010/0276668 | A1 | 11/2010 | Ko et al. |
| 2010/0301390 | A1 | 12/2010 | Ko et al. |
| 2010/0301392 | A1 | 12/2010 | Ko et al. |

OTHER PUBLICATIONS

Chui, C.O., et al., "Germanium *n*-type shallow junction activation dependences," Applied Physics Letters, vol. 87, 2005, pp. 091909-1-091909-3.

Datta, S., et al., "Ultrahigh-Speed 0.5 V Supply Voltage $In_{0.7}Ga_{0.3}As$ Quantum-Well Transistors on Silicon Substrate," IEEE Electron Device Letters, vol. 28, No. 8, Aug. 2007, pp. 685-687.

Iwakami, S., et al., "AlGaN/GaN Heterostructure Field-Effect Transistors (HFETs) on Si Substrates for Large-Current Operation," Japanese Journal of Applied Physics, vol. 43, No. 7A, 2004, pp. L831-L833.

Jackson, S.L., et al., "Silicon Doping of InP, GaAs, $In_{0.53}Ga_{0.47}As$ and $In_{0.49}Ga_{0.51}P$ Grown by Gas Source and Metalorganic Molecular Beam Epitaxy Using a $SiBr_4$ Vapor Source," IEEE, Conference Proceedings, Sixth International Conference on Indium Phosphide and Related Materials, Mar. 27-31, 1994, pp. 57-60.

Krishnamohan, T., et al., "High-Mobility Low Band-To-Band-Tunneling Strained-Germanium Double-Gate Heterostructure FETs: Simulations," IEEE Transactions on Electron Devices, vol. 53, No. 5, May 2006, pp. 1000-1009.

Posselt, M., et al., "P implantation into preamorphized germanium and subsequent annealing: Solid phase epitaxial regrowth, P diffusion, and activation," Journal of Vacuum Science Technology, vol. 26, Jan./Feb. 2008, pp. 430-434.

Satta, A., et al., "Diffusion, activation, and regrowth behavior of high dose P implants in Ge," Applied Physics Letters, vol. 88, 2006, pp. 162118-1-162118-3.

Satta, A., et al., "P implantation doping of Ge: Diffusion, activation, and recrystallization," Journal of Vacuum Science Technology, vol. 24, Jan./Feb. 2006, pp. 494-498.

Shih, C.-F., et al., "Blue, Green, and White InGaN Light-Emitting Diodes Grown on Si," Japanese Journal of Applied Physics, vol. 44, No. 4, 2005, pp. L140-L143.

Vanamu, G., et al., "Growth of high-quality GaAs on $Ge/Si_{1-x}Ge_x$ on nanostructured silicon substrates," Applied Physics Letters, vol. 88, 2006, pp. 251909-1-251909-3.

Vurgaftman, I., et al., "Band parameters for III-V compound semiconductors and their alloys," Journal of Applied Physics, vol. 89, No. 11, Jun. 1, 2001, pp. 5815-5875.

Yamane, Y., et al., "Selective Formation of Ohmic Contacts to *n*-GaAs," IEEE, Electronics Letters, vol. 23, No. 8, Apr. 9, 1987, pp. 382-383.

\* cited by examiner

FORMATION OF III-V BASED DEVICES ON SEMICONDUCTOR SUBSTRATES

CROSS-REFERENCE TO RELATED APPLICATIONS

This application relates to commonly-assigned U.S. patent application Ser. No. 12/639,653, filed Dec. 16, 2009, and entitled "High-Mobility Multiple-Gate Transistor with Improved On-to-Off Current Ratio," and U.S. patent application Ser. No. 12/616,068, filed Nov. 10, 2009, and entitled "Gradient Ternary or Quaternary Multiple-Gate Transistor," which applications are hereby incorporated herein by reference.

TECHNICAL FIELD

This disclosure relates generally to integrated circuit devices, and more particularly to the formation of III-V compound semiconductors on semiconductor substrates, and even more particularly to fin field-effect transistors (FinFETs) based on III-V compound semiconductors and methods of forming the same.

BACKGROUND

The speed of metal-oxide-semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V based transistors have been explored. However, III-V compound semiconductor films need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high quality III-V compound semiconductors. For example, III-V compound semiconductors were grown from trenches between shallow trench isolation regions to reduce the number of threading dislocations.

SUMMARY OF THE INVENTION

In accordance with one aspect, a device includes a semiconductor substrate, and insulation regions in the semiconductor substrate. Opposite sidewalls of the insulation regions have a spacing between about 70 nm and about 300 nm. A III-V compound semiconductor region is formed between the opposite sidewalls of the insulation regions.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming III-V compound semiconductors comprising group III and group V elements is provided in accordance with an embodiment. A fin field-effect transistor (FinFET), which uses a III-V compound semiconductor region as a fin, is formed. The intermediate stages of manufacturing embodiments are illustrated. Throughout the various views and illustrative embodiments, like reference numbers are used to designate like elements.

Figure 1B:
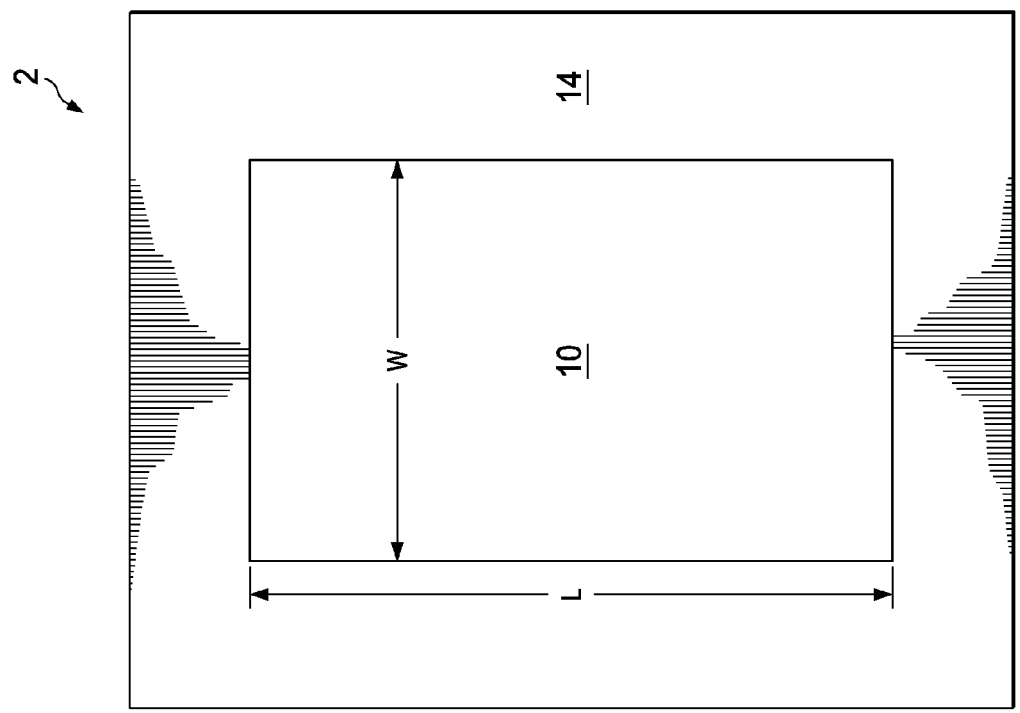
FIGS. 1A through 6 are cross-sectional views and a top view of intermediate stages in the manufacturing of a fin field-effect transistor (FinFET) in accordance with an embodiment, wherein a III-V compound semiconductor material is epitaxially grown to form the fin of the FinFET.
Figure 1A:
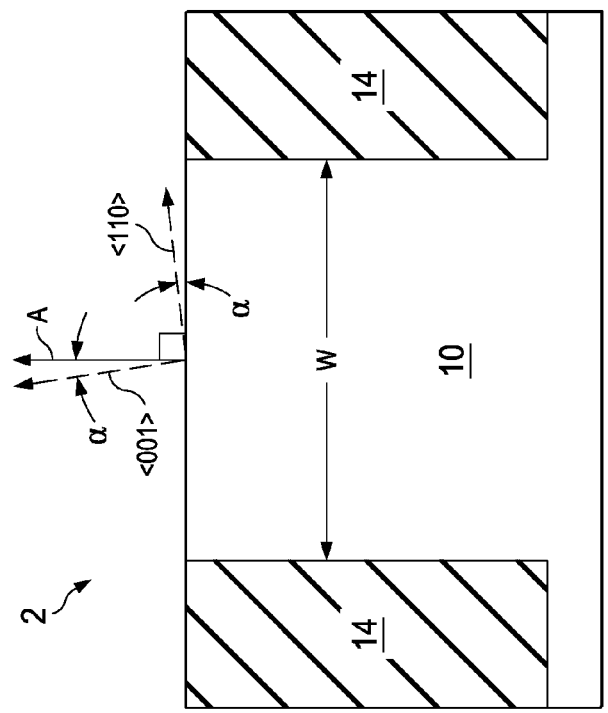

FIGS. 1A through 6 illustrate the cross-sectional views and top views of intermediate stages in the manufacturing of a FinFET. Referring to FIG. 1A, substrate 10, which is part of semiconductor wafer 2, is provided. Substrate 10 may be formed of silicon, although it may also be formed of other materials such as germanium, SiC, SiGe, GaAs, sapphire, or the like. Insulation regions such as shallow trench isolation (STI) regions 14 are formed in substrate 10. The formation process of STI regions 14 is known in the art, and hence is not discussed herein.

FIG. 1B illustrates an exemplary top view of the structure shown in FIG. 1A. The portion of substrate 10 defined (encircled) by STI regions 14 has length L and width W, with L being equal to or greater than width W. It is noted that although shown in FIG. 1B, the region defined by STI region(s) 14 is not necessarily rectangular. Referring back to FIG. 1A, width W (also referred to as trench width W hereinafter as it is also the width of trench 18 in FIG. 2) may be between about 10 nm and about 600 nm. Further, to improve the quality of the subsequently grown III-V semiconductor region 22 (not shown in FIGS. 1A and 1B, please refer to FIG. 3), width W is limited in an optimized range. In an embodiment, the optimized range is between about 30 nm and about 300 nm, or between about 70 nm and about 300 nm. Further, the optimized range is related to the characteristics of substrate 10 and the material of the subsequently grown III-V compound semiconductor region 22 (FIG. 3). For example, the optimized range of width W is related to the off angle α (FIG. 1A) of substrate 10, wherein off angle α is the deviation of the surface orientation A of substrate 10 from a commonly used major surface orientation. For example, in FIG. 1A, surface orientation A may be close to <001> direction (surface orientation), but deviates toward <110> direction by an angle referred to as off angle α. Accordingly, if surface orientation A of substrate 10 is exactly in <001> direction, off angle α is 0°.

Off angle α, depending on design preferences, may be 2°, 4°, 6°, 8°, or the like. The optimized range of width W may be smaller when off angle α is greater, and may be greater when off angle is smaller. In an exemplary embodiment wherein off angle α is 2°, the optimized range of width W is between about 80 nm and about 300 nm. When off angle α is increased to between about 4° and about 6°, the optimized range of width W may be reduced to between about 20 nm and about 150 nm. The optimum ranges of width W may be found through experiments.

Figure 2:
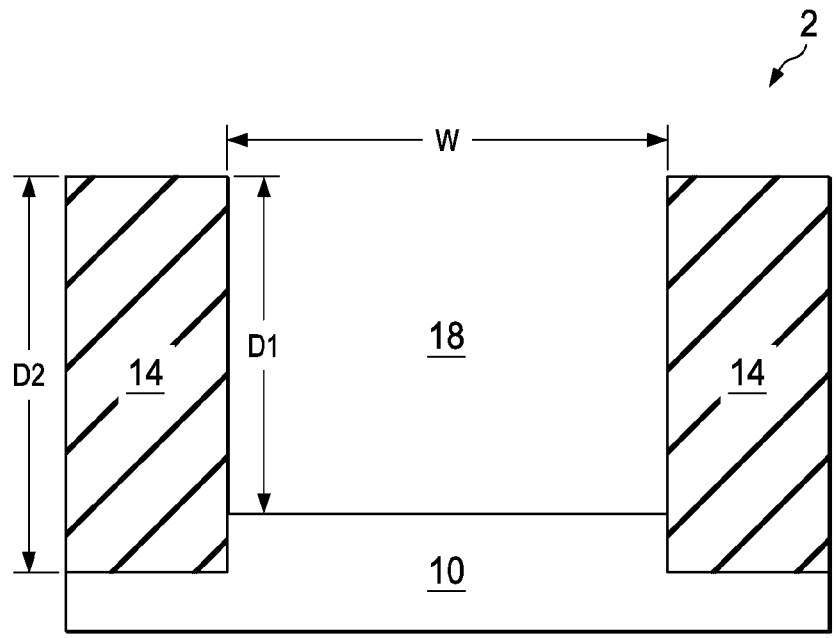
Figure 3:
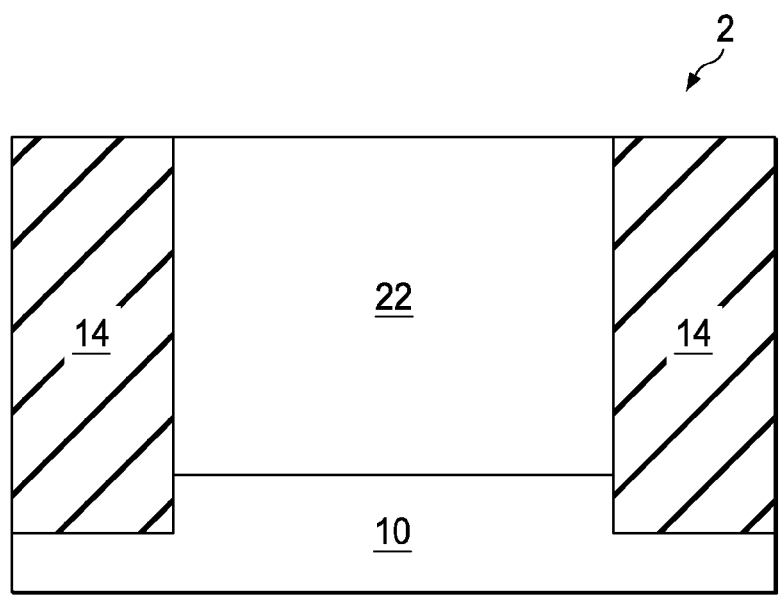

Next, as shown in FIG. 2, the portion of substrate 10 between opposite sidewalls of insulation regions 14 is recessed to form trench 18. Recessing depth D1 may be substantially equal to or less than thickness D2 of insulation regions 14. Furthermore, recessing depth D1 may be between about 50 nm and about 400 nm, for example.

In FIG. 3, III-V compound semiconductor region 22 is epitaxially grown in trench 18. III-V compound semiconductor region 22 may include, but is not limited to, GaAs, InP, GaN, InGaAs, InAlAs, GaSb, AlSb, AlAs, AlP, GaP, combinations thereof, and multi-layers thereof. The top surface of III-V compound semiconductor region 22 may be level with, higher than, or lower than, a top surface of substrate 10. In an embodiment, III-V compound semiconductor region 22 includes a gradient composition, with the compositions of lower portions gradually changed to the desirable composition of upper portions. Also, the bottom portion of III-V compound semiconductor region 22 may have a lattice constant closer to the lattice constant of substrate 10, while the lattice constant mismatch between III-V compound semiconductor region 22 and substrate 10 gradually increases from the bottom to the top of III-V compound semiconductor region 22.

Figure 4:
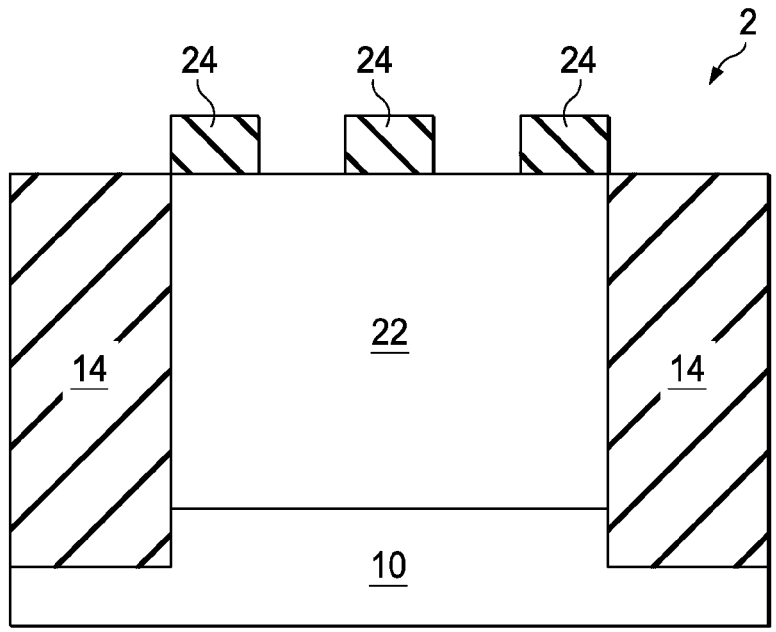
Figure 5A:
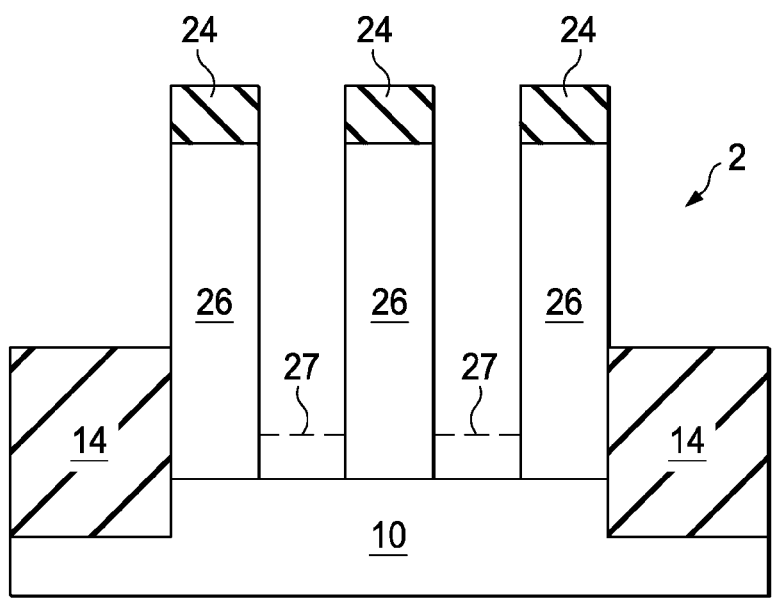
Figure 5B:
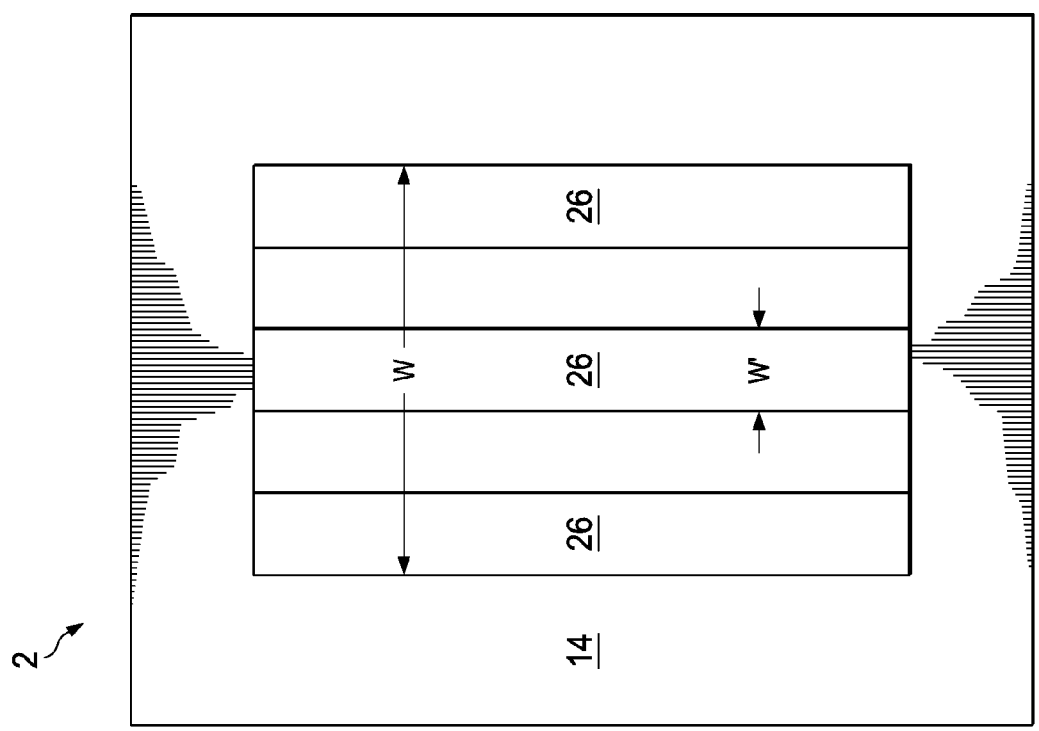

Referring to FIG. 4, mask 24 is formed over III-V compound semiconductor region 22, and is then patterned. Mask 24 may be a photo resist or a hard mask formed of, for example, silicon nitride. The exposed portions of III-V compound semiconductor region 22 are then etched, for example, using an anisotropic etching. The etching may be stopped when substrate 10 is reached. Alternatively, the etching may be stopped before substrate 10 is exposed. The resulting structure is shown in FIGS. 5A and 5B, with the remaining portions of III-V compound semiconductor region 22 being denoted as fins 26. Referring to FIG. 5A, dotted lines 27 represent alternative positions at which the etching is stopped. The upper portions of insulation regions 14 may also be selectively etched, while the bottom portions are left un-etched. As a result, III-V compound semiconductor region 22 has a portion higher than the un-etched bottom portions of insulation regions 14, thus forming fins 26. Mask 24 is then removed.

FIG. 5B illustrates a top view of the structure shown in FIG. 5A. It is observed that a plurality of parallel III-V semiconductor fins 26 may be formed in the region defined by STI regions 14. Each of III-V semiconductor fins 26 has an area (in the top view) smaller than the area of the region defined by STI region 14. Further, widths W' of III-V semiconductor fin 26 are smaller than trench width W, and may be smaller than about 30 nm. In an exemplary embodiment widths W' may be about 10 nm. Widths W' may further be smaller than about 50 percent, or even 20 percent, of trench width W.

Figure 6:
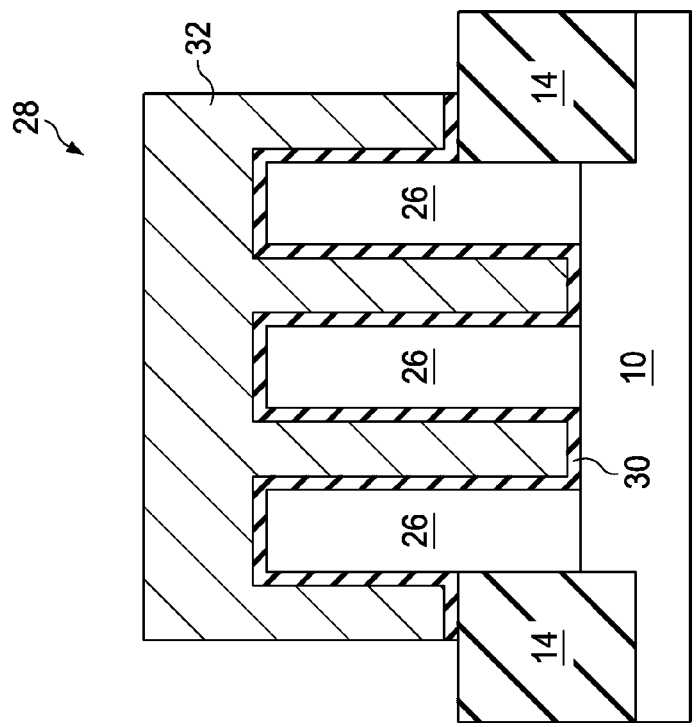

The structure shown in FIGS. 5A and 5B may be used to form fin field-effect transistor (FinFET) 28, as shown in FIG. 6. Referring to FIG. 6, gate dielectric 30 and gate electrode 32 are formed. Gate dielectric 30 may be formed of commonly used dielectric materials such as silicon oxide, silicon nitride, oxynitrides, multi-layers thereof, and combinations thereof. Gate dielectric 30 may also be formed of high-k dielectric materials. The exemplary high-k materials may have k values greater than about 4.0, or even greater than about 7.0. Gate electrode 32 may be formed of doped polysilicon, metals, metal nitrides, metal silicides, and the like. The bottom ends of gate dielectric 30 may contact the top surface of insulation regions 14 and/or substrate 10. In some embodiments, as shown in FIG. 6, one of III-V compound semiconductor fins 26 (the left one or the right one) includes two sidewalls, with the first sidewall being shorter than the second sidewall that is opposite to the first sidewall. Accordingly, gate dielectric 30 on the respective fin 26 also has a first sidewall portion and a second sidewall portion having different heights. After the formation of gate dielectric 30 and gate electrode 32, source and drain regions (not shown) may be formed. The details of the remaining formation process of FinFET 28 are known in the art, and hence are not discussed herein.

Figure 7:
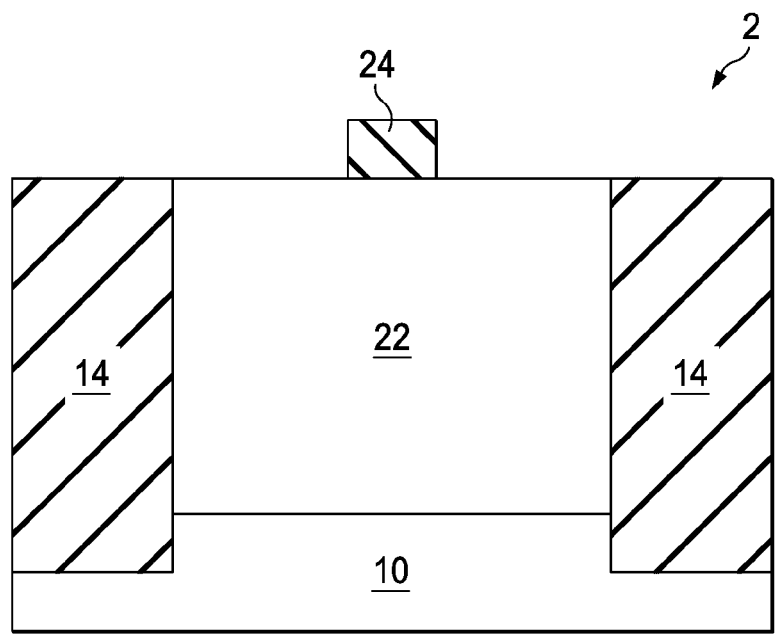
FIGS. 7 through 10 are cross-sectional views and top views of intermediate stages in the manufacturing of a FinFET in accordance with an alternative embodiment.
Figure 8:
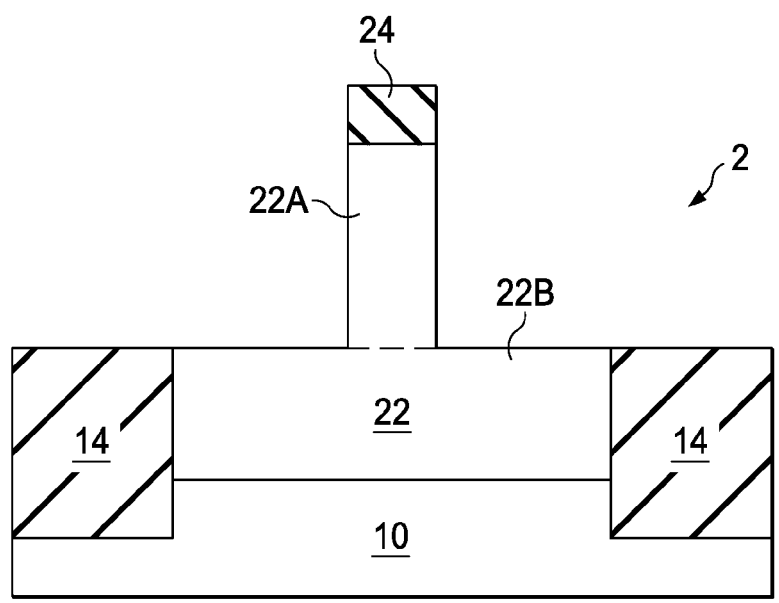
Figure 10:
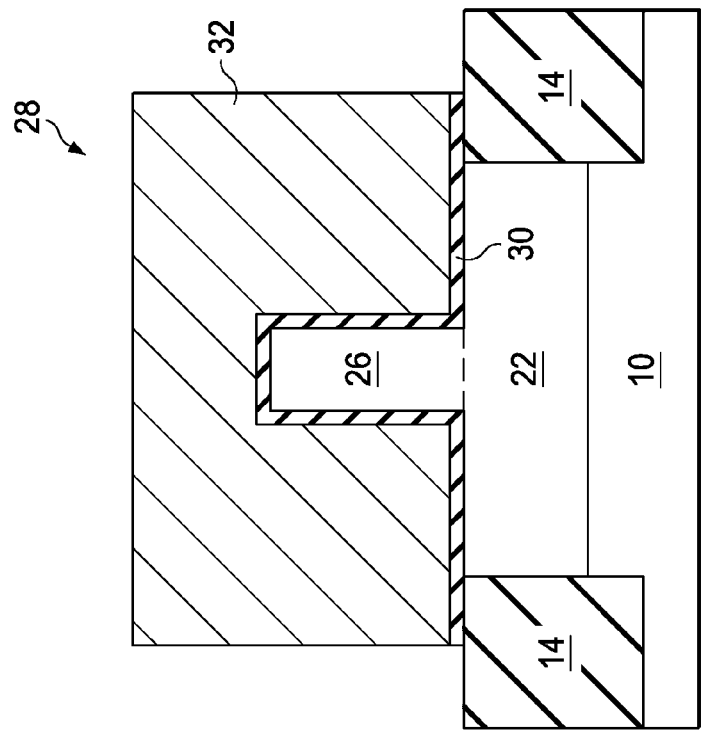
Figure 9:
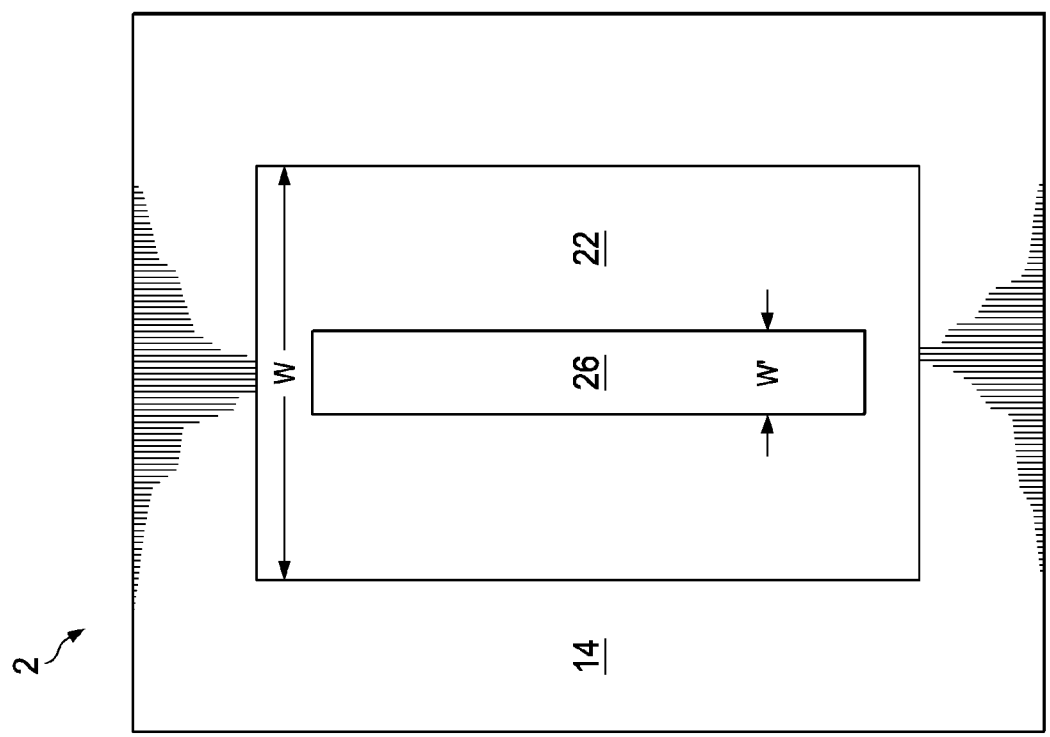

FIGS. 7 and 10 illustrate the formation of a FinFET in accordance with various other embodiments. Unless specified otherwise, the reference numerals in these embodiments represent like elements in the embodiments illustrated in FIGS. 1A through 6. The initial steps of these embodiments are essentially the same as shown in FIGS. 1A through 3. Next, as shown in FIG. 7, mask 24 is formed and patterned. However, compared to the mask 24 shown in FIG. 4, only one piece of mask 24 is left directly over III-V compound semiconductor region 22. An etch is then preformed to form III-V compound semiconductor fin 26, as is shown in FIG. 8. In an embodiment, a top portion 22A of III-V compound semiconductor region 22 is etched, while a bottom layer 22B of III-V compound semiconductor region 22 is not etched. The remaining portion of top portion 22A is referred to as semiconductor fin 26 hereinafter, as illustrated in FIGS. 9 and 10. In alternative embodiments, the etching may also be continued until substrate 10 is reached (similar to what is shown in FIG. 5A). Mask 24 is then removed.

FIG. 9 illustrates a top view. It is observed that the width of III-V semiconductor fin 26 is reduced from trench width W to W' to fit the requirement for forming a FinFET. In an embodiment, width W' of III-V semiconductor fin 26 is smaller than about 30 nm. Widths W' may further be less than about 50 percent of trench width W. FIG. 10 illustrates FinFET 28 (including gate dielectric 30 and gate electrode 32), which is based on III-V semiconductor fin 26.

FIGS. 7 and 10 illustrate the formation of a FinFET in accordance with various other embodiments. Unless specified otherwise, the reference numerals in these embodiments represent like elements in the embodiments illustrated in FIGS. 1A through 6. The initial steps of these embodiments are essentially the same as shown in FIGS. 1A through 3. Next, as shown in FIG. 7, mask 24 is formed and patterned. However, compared to the mask 24 shown in FIG. 4, only one piece of mask 24 is left directly over III-V compound semiconductor region 22. An etch is then preformed to form III-V compound semiconductor fin 26, as is shown in FIG. 8. In an embodiment, a top portion of III-V compound semiconductor region 22 is etched, while a bottom layer of III-V compound semiconductor region 22 is not etched. In alternative embodiments, the etching may also be continued until substrate 10 is reached (similar to what is shown in FIG. 5A). Mask 24 is then removed.

FIG. 9 illustrates a top view. It is observed that the width of III-V semiconductor fin 26 is reduced from trench width W to W' to fit the requirement for forming a FinFET. In an embodiment, width W' of III-V semiconductor fin 26 is smaller than about 30 nm. Widths W' may further be less than about 50 percent of trench width W. FIG. 10 illustrates FinFET 28

(including gate dielectric 20 and gate electrode 32), which is based on III-V semiconductor fin 26.

Figure 11:
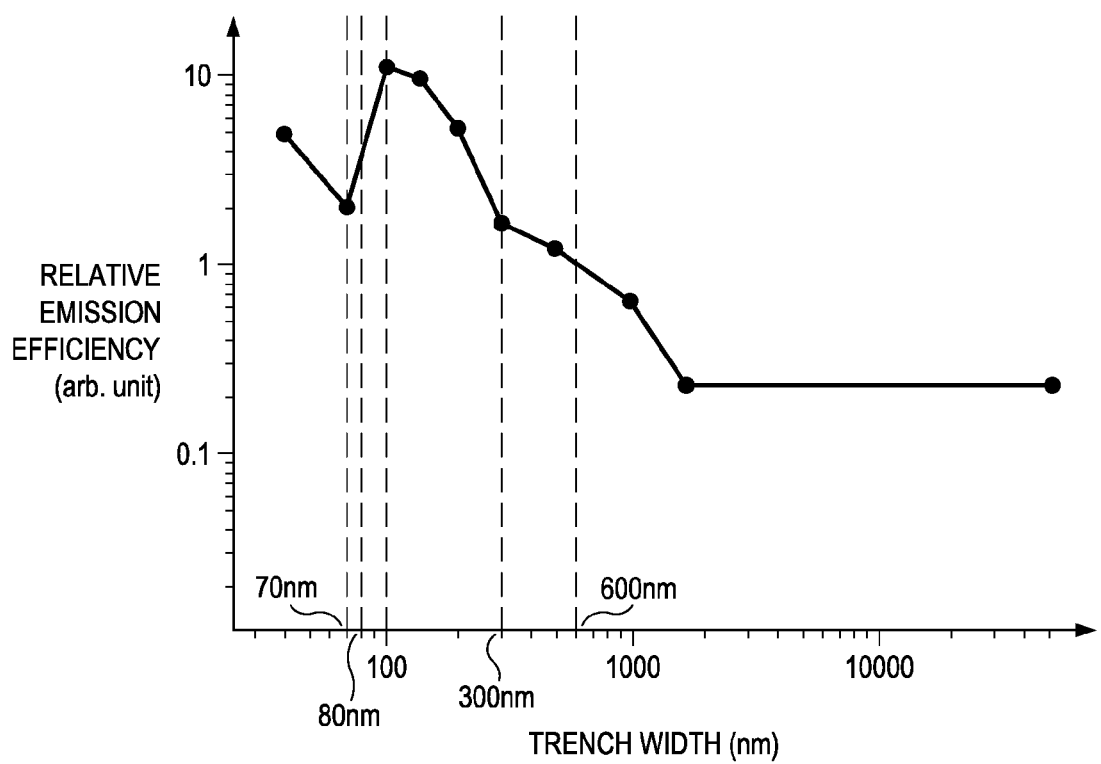
FIG. 11 illustrates the correlation between the quality of III-V compound semiconductor materials as a function of widths of trenches, with the III-V compound semiconductor materials epitaxially grown in the trenches.

FIG. 11 illustrates experimental results illustrating the quality of epitaxially grown III-V films as a function of the widths W of trenches, from which III-V compound semiconductor regions 22 were epitaxially grown (please refer to FIG. 3). The X-axis represents trench widths W, while the Y-axis represents relative emission efficiencies. The relative emission efficiencies were obtained by stimulating epitaxially grown III-V compound semiconductor samples (that are grown from the trenches) with electrons, and measuring the light intensity of the emitted light. The resulting light intensity is normalized to a light intensity obtained from a bulk III-V compound semiconductor sample, which sample is commercially available on market. The relative emission efficiencies reflect the quality of the epitaxially grown III-V compound semiconductors, and the higher the relative emission efficiencies, the better the quality. If the relative emission efficiency is equal to 1, it indicates that the respective sample has a quality comparable to the commercially available sample.

FIG. 11 reveals that if the epitaxially grown III-V compound semiconductors (with GaAs used in the samples) were grown from trenches with widths less than about 600 nm, the quality of the sample is better than the commercially available bulk GaAs sample. When the trench widths further reduce, the quality of the respective III-V compound semiconductors is further improved. The experimental results also reveal that the quality of the GaAs samples peaks when the trench widths are reduced to certain values, for example, about 100 nm. Further reducing the trench widths, the quality degrades from the peak value. One possible reason is that when the trench widths reduce from big values, for example, 600 nm or 1,000 nm, the number of threading dislocations are reduced, resulting in improved quality. However, when the trench widths are too small, planar defects such as twins and stacking faults start to dominate, causing the degradation of the quality. Therefore, an optimized range of trench widths exist. This finding is different from the conventionally conceived concept that the smaller the trench widths are, the better the quality of the epitaxially grown III-V compound semiconductors is.

Furthermore, it was observed through experiments that the optimum range of trench widths are related to various factors including the characteristics of the substrates such as the surface orientation and off angles. The off angles of the substrates affect the crystalline structure and the stacking of atoms of substrates, and in turn affect the quality of the epitaxially grown III-V compound semiconductors.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate having a surface orientation with an off angle between about 4° and about 6° from <001> direction;
insulation regions in the semiconductor substrate, wherein opposite sidewalls of the insulation regions have a spacing between about 20 nm and about 150 nm; and
a III-V compound semiconductor region between the opposite sidewalls of the insulation regions.

2. The device of claim 1, wherein at least a top portion of the III-V compound semiconductor region has a width measured in a direction same as a direction of the spacing, and wherein the width is less than the spacing.

3. The device of claim 1, wherein a bottom of the III-V compound semiconductor region contacts the semiconductor substrate.

4. The device of claim 1, wherein the insulation regions are shallow-trench isolation (STI) regions.

5. The device of claim 1, wherein the region defined by the insulation regions has a length no smaller than the spacing, and wherein the length and the spacing are measured in perpendicular directions.

6. The device of claim 1 further comprising a fin field-effect transistor (FinFET) comprising:
a gate dielectric on a sidewall and a top surface of at least a top portion of the III-V compound semiconductor region; and
a gate electrode over the gate dielectric.

7. A device comprising:
a silicon substrate having a surface orientation with an off angle of 2° from <001> direction;
insulation regions in the silicon substrate, wherein opposite sidewalls of the insulation regions have a spacing, and wherein the spacing is between about 80 nm and about 300 nm; and
a III-V compound semiconductor region over and contacting the silicon substrate and between the opposite sidewalls of the insulation regions, wherein a width of at least a top portion of the III-V compound semiconductor region is smaller than the spacing.

8. The device of claim 7, wherein the spacing is between about 80 nm and about 150 nm.

9. The device of claim 7, wherein a top surface of the III-V compound semiconductor region is higher than a top surface of the insulation regions.

10. The device of claim 9, wherein the top surface of the III-V compound semiconductor region is substantially level with a top surface of the silicon substrate.

11. The device of claim 7, wherein the III-V compound semiconductor region further comprises a bottom portion under the top portion, wherein the top portion has the width, and wherein an additional width of the bottom portion is equal to the spacing.

12. The device of claim 7 further comprising at least one additional III-V compound semiconductor region in the region between the insulation regions, with each of the at least one additional III-V compound semiconductor region being parallel to the top portion of the III-V compound semiconductor region.

13. The device of claim 7 further comprising a fin field-effect transistor (FinFET) comprising:

a gate dielectric on a sidewall and a top surface of the top portion of the III-V compound semiconductor region; and a gate electrode over the gate dielectric.

14. A device comprising:

a silicon substrate;

shallow trench isolation (STI) regions in the silicon substrate, wherein the STI regions comprise top surfaces; and a III-V compound semiconductor region in a region encircled by the STI regions, wherein the III-V compound semiconductor region comprises portions over the top surfaces of the STI regions;

a gate dielectric comprising:

a first sidewall portion on a first sidewall of the III-V compound semiconductor region; and a second sidewall portion opposite to the first sidewall portion and on a second sidewall of the III-V compound semiconductor region, wherein the first sidewall portion has a height smaller than a height of the second sidewall portion.

15. The device of claim 14, wherein the first sidewall portion of the gate dielectric has a bottom contacting the top surfaces of the STI regions, and wherein the second sidewall portion comprises a bottom contacting a top surface of a semiconductor material.

16. The device of claim 14, wherein the first sidewall of the III-V compound semiconductor region is substantially aligned to a sidewall of the STI regions.

* * * * *